United States Patent [19]
Goedicke et al.

[11] Patent Number: 5,470,388
[45] Date of Patent: Nov. 28, 1995

[54] DEVICE FOR THE VACUUM COATING OF MASS PRODUCED PRODUCTS

[75] Inventors: Klaus Goedicke; Christoph Metzner; Joerg Schmidt; Ullrich Heisig; Siegfried Schiller; Jonathan Reschke, all of Dresden, Germany

[73] Assignee: Fraunhofer-Gesellschaft Zur Foederung der angewandten Porschung e.V., Munich, Germany

[21] Appl. No.: 307,663

[22] PCT Filed: Mar. 3, 1993

[86] PCT No.: PCT/DE93/00201
§ 371 Date: Nov. 23, 1994
§ 102(e) Date: Nov. 23, 1994

[87] PCT Pub. No.: WO93/19217
PCT Pub. Date: Sep. 30, 1993

[30] Foreign Application Priority Data

Mar. 23, 1992 [DE] Germany .......................... 42 09 384.8

[51] Int. Cl.[6] .................................................. C23C 14/00
[52] U.S. Cl. ........................ 118/716; 118/723 EB; 118/726; 204/298.23; 204/298.26; 204/298.28
[58] Field of Search ................... 118/716, 723 EB, 118/726; 204/298.23, 298.26, 298.28

[56] References Cited

U.S. PATENT DOCUMENTS

| 2,846,971 | 8/1958 | Baer et al. | 118/716 |
| 3,395,674 | 8/1968 | Burham et al. | 118/716 |
| 4,116,161 | 9/1978 | Steube | 118/716 |

FOREIGN PATENT DOCUMENTS

| 257554A3 | 6/1988 | Germany . |
| 293376A5 | 8/1991 | Germany . |

*Primary Examiner*—Richard Bueker
*Attorney, Agent, or Firm*—Evenson McKeown Edwards & Lenahan

[57] ABSTRACT

Device for the vacuum coating of mass produced products. By means of the device small parts, such as screws and bolts, as mass produced products are highly productively coated by vacuum deposition or sputtering, also under plasma action. In a container is located a drum rotatable at high speed about its horizontal axis and in which the parts to be coated are fixed to the inner wall by centrifugal force. The surface of the inner wall is geometrically constructed such that the parts to be coated are reliably held and moved with it. The coating devices are located in the drum. A stripping device, whose spacing with respect to the inner wall is adjustable at programmable time intervals, is located in the drum and has an abutment surface directed opposite to the rotation direction.

15 Claims, 1 Drawing Sheet

DEVICE FOR THE VACUUM COATING OF MASS PRODUCED PRODUCTS

BACKGROUND AND SUMMARY OF THE INVENTION

The present invention relates to a device for the all-sided coating of relatively small parts in large numbers (mass produced products). The coatings are applied by vacuum evaporation, vacuum deposition (magnetron sputtering) and/or ion plating (plasma-assisted vacuum evaporation). The parts to be coated are preferably machine components (bolts, screws), but also other parts, which are to have a decorative, hard, wear-reducing, electrically conductive or corrosive-preventing surface. Other, not specified characteristics of surfaces are also to be produced or improved. It is also possible to coat according to this process small parts made from plastics or ceramics.

It is known in connection with vacuum coating to fix the parts to be coated in suitable holding devices and to guide them one or more times through the coating zone of a vacuum evaporator, a sputtering source or some other vapor source for physical vapour deposition (PVD) and then remove the holding devices again after applying the coatings. Apart from the costs of the holding devices and the time taken for fixing and removing parts, the fundamental disadvantage exists that areas of the surface of the parts are always covered and remain uncoated.

In much the same way as for electrochemical coating deposition (CVD), it is known to receive the parts in the form of mass produced products in a basket made from partly permeable materials (wire gauze, perforated metal plates) and bring the same into the vapor zone of a PVD vapor source for coating purposes. The basket rotates about a horizontal axis in order to achieve a mixing movement of the parts, while making use of gravity. Unlike in the case of electrochemical deposition from the liquid phase, such methods are not very suitable for PVD coatings. There is a poor vapor utilization and the openings in the basket are closed by the coating after a short operating period and are no longer effective (JP-A 61-194177). An inclined position of the drum or an eccentric mounting thereof lead to the same deficiencies (U.S. Pat. No. 3,511,644).

An attempt has therefore been made to replace the basket by chains or perforated belts, optionally combined with vibrators, in order to better realize the aim of the coating operation. However, the described deficiencies have not been effectively removed and the apparatus costs are unacceptably high in view of the minor advantage obtained.

It is also known to receive the parts to be coated as mass produced products in a rotary basket and place one or more sputtering sources within said basket (East German patent 257 552 A3, East German patent 257 554 A3). By means of devices fixed to the basket it is ensured that the parts are carried along over a portion of the circumference and then roll back due to gravity. This leads to a mixing movement of the parts during the coating process and therefore to an all-sided coating. However, it is a disadvantage of this process that it is only possible to coat "from top to bottom", i.e. the coating sources can only be constituted by magnetrons, so that the disposition rate is limited. The resulting high coating costs are the reason why this process is only used for very special coatings, e.g. very thin resistance coatings. As all the parts are always under the action of gravity in a spatially confined area in the lower portion of the basket, it has also not been possible to simultaneously introduce into the process plasma sources during the coating process (for ion plating) or an effective cooling of the heat-sensitive parts. Therefore some known rotary basket sputtering plants are limited to specific uses.

For coating granular materials in vacuo it is known to introduce the same into a rotary drum housing and evaporator. This drum rotates at such a high speed that the granular materials to be coated are pressed against the wall by centrifugal force. As a result of a pulsating speed change the granular materials are circulated on becoming detached from the circumference (East German patent 293 376). The evaporator is covered by a screen, so that when the centrifugal force does not act during speed reduction the particles do not drop into the evaporator. However, this leads to the disadvantage of cutting off the vapor flow and considerably reducing the coating rate. Another disadvantage results from intermittent operation, in that the constant deceleration and reacceleration of the drum causes problems in view of the considerable mass. There are also problems when removing the coated granular material, in that a tilting of the drum is necessary, which involves high mechanical costs.

It is also known to fix a plurality of substrates to the outer circumference of a rotating drum or to a rotary table and move the substrates in such a way that all points of the substrate surface periodically and at time intervals are subject to the action of the ion flow and the vapor flow (East German patent 110 521). However, these systems suffer from the same deficiencies as the first-described systems. The substrates are partly covered by the holding devices and component insertion and removal is very time-consuming.

A device for coating mass produced products is known, which comprises a drum rotating about a horizontal axis. The drum rotates at such a high speed that the parts located within it are kept on the drum surface by centrifugal force. The coating device is located within the drum (U.S. Pat. No. 2,846,971). However, this device suffers from the shortcoming that the parts to be coated are not reliably fixed in the drum, in that the drum surface is planar. In addition, the stripping bar located in the vicinity of the drum surface operates continuously, so that there is no adaptation to the coating process. It is finally disadvantageous that the device is only suitable for batch operation.

The problem of the invention is to provide a device in order to bring about an all-sided coating in vacuo of small parts as mass produced products. Coating is to be possible either from an evaporator crucible, i.e. from the liquid phase, or by sputtering. The means known from PVD technology for improving the coating characteristics (plasma action or ion bombardment, cooling, heating, etc.) must be usable. The device must not be significantly more complicated than the known vacuum coating devices and must permit a highly productive coating.

The problem is solved with a device which comprises a drum rotating in a container about its horizontal axis and whose speed is kept constant and is so high that the parts to be coated and located in the drum are kept on the inner wall of the drum by centrifugal force. The drum contains flow resistances and coating devices. According to the invention the inner wall of the drum has a geometrical surface structure such that the parts to be coated are reliably fixed in the drum rotation direction and consequently adhering to the inner wall are moved therewith. The drum contains a stripping device, which is adjustable in spaced manner with respect to the inner wall and can be switched off at programmable time intervals. This stripping device has an abutting surface directed opposite to the drum rotation direction in order to adequately detach from the drum surface the parts to be coated. In certain embodiments, the abutting surface is designed so as to be resilient or brush-like against the drum inner wall, so that in particular in the case of small parts a reliable stripping from the inner wall is ensured.

The action of the device is such that the drum rotates with such a high speed that the parts are pressed by the centrifugal force onto the inner drum circumference and are fixed there, being constantly moved through the coating zone. By [means of] mechanical means located outside the coating zone, but in the drum, the parts are stripped from the circumference, so that a position change occurs. Following detachment they are again pressed by centrifugal force onto the drum inner wall. Necessarily there is a constant position change of the parts during the cyclic passage through the coating zone, which ensures an all-sided, uniform coating of the parts. This process is repeated until the desired coating thickness is attained.

In order to prevent dropping out of the parts to be coated during stripping from the inner wall and prevent the necessarily occurring mixing, advantageously the outer edges of the drum are raised inwards.

For producing certain coatings or coating systems the parts are moved several times through the coating zone without any position change. Therefore a cycle comprises several coating passes between each position change and which is repeated until the entire coating is applied. For producing high-grade coatings it is also possible to move the parts that are fixed to the inner circumference of the rotary drum locally and in time-succeeding manner through the vapor zone of an evaporator and the zone of a plasma or ion source. Following each pass the parts are stripped from the drum by mechanical means in order to bring about the position change. This cycle is repeated until the entire coating is applied.

If it is a question of coating heat-sensitive parts, e.g. made from plastic, it is possible to cool the drum. This takes place according to the invention either by cooling ducts in the drum wall or a double-walled drum construction, so that the coolant can flow through the same. It is also provided in certain embodiments to increase the drum speed in order to obtain a higher centrifugal force, so that the parts have a better contact with the drum wall, which ultimately improves cooling.

To increase productivity and improve reproducibility of the process during the rotation of the drum the parts are introduced by a vacuum lock and a guiding device. In order to permit drum emptying in the rotating state, certain embodiments place in the drum a switchable emptying device, which strips the parts from the inner drum wall or engages same in a free fall area and conveys them by guiding devices and via a vacuum lock onto a guiding device fixed outside the drum. As a result the supply of parts can take place without stopping the rotary drum and several batches can be successively coated without vacuum interruption.

The inner wall of the drum with its special geometrically pronounced surface structure means that the parts are held on the wall without any special holding devices, i.e. an adequate static friction of the parts is guaranteed before and after the mixing phase. Preferably the surface structure is formed by axially directed notches, whose one flank is steep in the rotation direction and whose other flank is shallow counter to the drum rotation direction. The spacing of the notches must be smaller than the average length of the parts to be coated. In conjunction with gravity corresponding guiding devices bring about a position change of the parts and a refixing and further movement on the drum wall through the coating chamber. The drum contains fixed flow resistances so that, in conjunction with the gas intake and vacuum pumping system, the gas pressure and/or gas composition is controlled during coating in the coating zone. The screen above the coating device serves to interrupt the coating.

The device according to the invention has the advantages that small parts in the form of mass produced products, such as e.g. screws, bolts and contact elements, can be coated in an all-sided, uniform manner in vacuo and no holding devices are required for these parts. It is possible to use different vacuum coating modes, such as evaporation and sputtering, but also plasma action or ion bombardment. The device ensures a high productivity, because charging and emptying without vacuum interruption are possible. The parts to be coated can have a random shape and this also applies with respect to the coatings to be applied.

Other objects, advantages and novel features of the present invention will become apparent from the following detailed description of the invention when considered in conjunction with the accompanying drawings.

DETAILED DESCRIPTION OF THE DRAWINGS

Figure 1:
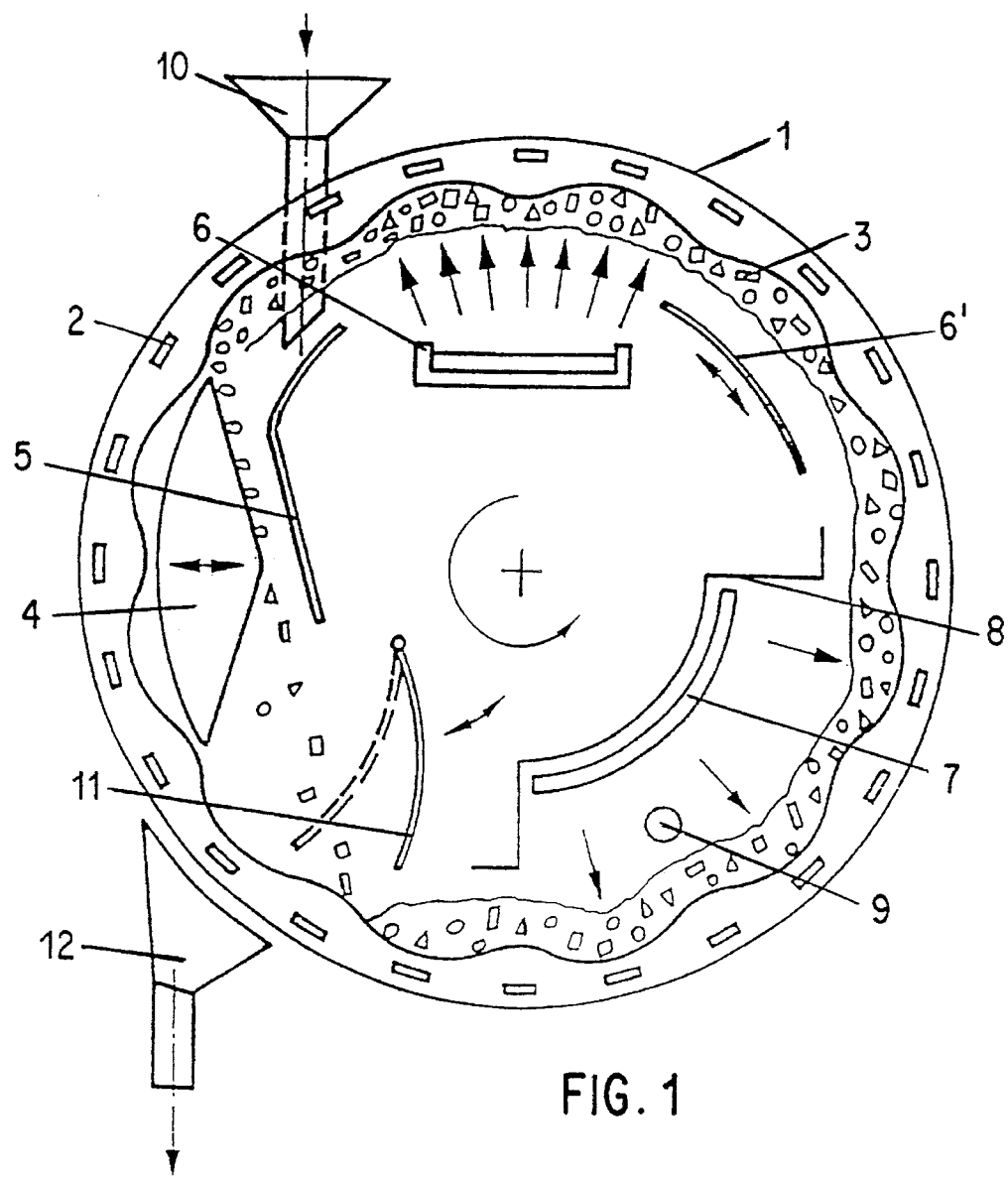
FIG. 1 shows a device constructed in accordance with the present invention in section.

A horizontally mounted drum 1, in whose walls are located cooling ducts 2, is rotated at such a high speed that the parts 3 to be coated are pressed by centrifugal force against the wall and are fixed to the wall. The necessary speed is:

$$n = \frac{1}{t} > \frac{1}{2\pi} \sqrt{\frac{g}{R}}$$

t=time for one rotation
n=number of rotations of the drum
g=acceleration of gravity 9.81 ms$^{-2}$
R=drum radius.

The centrifugal force must be higher than the weight of the parts 3.

A stripping device 4 is arranged in fixed manner in the drum 1, but its spacing from the wall of the drum 1 is adjustable. As a result the parts 3 that are fixed by centrifugal force to the wall of the drum 1 are stripped from the wall during each rotation or at specific time intervals, when the stripping device 4 comes into action, and pass by gravity downwards, so that they assume a different position and are again fixed to the wall. A guide plate 5 regulates the fall of the parts 3 and determines the impact point on the inner wall of the drum 1. In the drum 1 is arranged in fixed manner a crucible of an electron beam evaporator 6, which can be closed by [means of] a pivotable screen 6. A plasma etcher 7 is arranged in a fixed manner upstream of the electron beam evaporator 6 with respect to rotation direction. The plasma etcher 7 is surrounded by a shield 8, in whose vicinity reaction gas is supplied through the opening 9.

By means of a suitably positioned filling device 10, in conjunction with a not shown vacuum lock and guidance devices, the parts 3 to be coated are introduced into the rotary drum 1. A pivotable chute 11, which is pivoted against the wall for the removal of the coated parts 3 from the rotary drum 1, guides the parts 3 by means of not shown guidance devices and an emptying device 12, with an integrated vacuum lock, in the downwards direction. Thus, it is possible to fill and empty the drum 1 during rotation.

Figure 2:
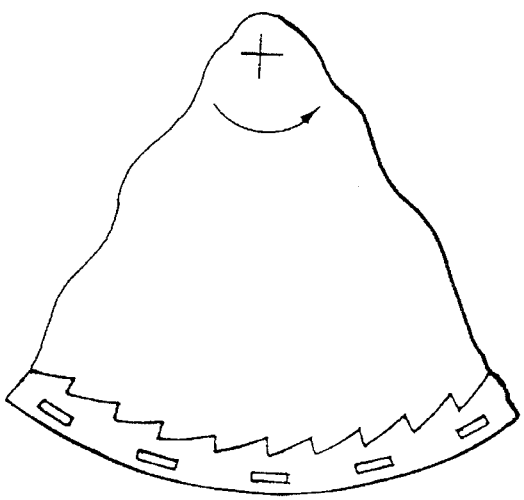
FIG. 2 shows a detail of the drum wall of the present invention.

FIG. 2 shows a detail of the surface of the drum 1. The surface is provided with axially directed notches 13. The flank in the rotation direction is shallow and is steep counter to the rotation direction, so that the parts 3 better adhere, i.e. are fixed to the surface of the drum 1.

Although the invention has been described and illustrated in detail, it is to be clearly understood that the same is by way of illustration and example, and is not to be taken by way of limitation. The spirit and scope of the present invention are to be limited only by the terms of the appended claims.

What is claimed is:

1. Device for the vacuum coating of mass produced products by evaporation, sputtering or plasma-activated coating, comprising:

a drum rotating constantly about its horizontal axis at such a speed that the parts located for coating purposes within said drum are held by centrifugal force on an inner wall of said drum, said drum having at least one coating device and at least one flow resistance, wherein a surface structure of the inner wall is geometrically constructed such that the parts to be coated are reliably fixed in the rotation direction of the drum and are movable with the drum;

a stripping device in said drum, the stripping device being adjustably spaced with respect to the inner wall of the drum, the stripping device being switchable off at programmable time intervals for the parts to be coated and having an abutting surface directed opposite to the rotation direction of the drum.

2. Device according to claim 1, wherein the surface structure of the inner wall of the drum is formed by axially directed notches, said notches having flanks that are steep in the rotation direction and shallow counter to the rotation direction.

3. Device according to claim 2, wherein a spacing between the notches is smaller than an average length of the parts to be coated.

4. Device according to claim 1, wherein the drum contains an emptying device stripping the parts from the inner wall or receiving the parts in another area, a guiding device, and a vacuum lock, said emptying device, said guiding device and said vacuum lock leading said parts to the outside of the drum.

5. Device according to claim 1, wherein the wall of the drum includes cooling ducts through which a coolant flows.

6. Device according to claim 1, wherein the drum has a double-wall construction with a cavity and a coolant flows through the cavity.

7. Device according to claim 1, wherein the at least one coating device is at least one sputtering source.

8. Device according to claim 1, wherein the at least one coating device is at least one electron beam evaporator.

9. Device according to claim 8, further comprising a pivotable screen 6' above each electron beam evaporator.

10. Device according to claim 1, further comprising, outside the drum, a fixed filling device in conjunction with a vacuum lock and a guiding device leading into the drum.

11. Device according to claim 1, further comprising at least one of resilient elements and brushes on an abutting surface of the stripping device against the wall of the drum.

12. Device according to claim 1, further comprising guide plates arranged in the drum such that during the rotation of the drum the parts are moved from the center of the drum to the edge and vice versa.

13. Device according to claim 1, wherein the drum has a coating zone, and an electron beam evaporator and a sputtering source in the coating zone, and at least one of flow resistances and walls that separate the electron beam evaporator and the sputtering source.

14. Device according to claim 13, further comprising in addition to the electron beam evaporator in the rotation direction upstream thereof at least one of a plasma and ion source shielded from the remaining inner chamber.

15. Device according to claim 1, wherein both sides of the drum have circumferentially inwardly directed edges.

* * * * *